(12) United States Patent
Gilton

(10) Patent No.: US 6,194,326 B1
(45) Date of Patent: Feb. 27, 2001

(54) LOW TEMPERATURE RINSE OF ETCHING AGENTS

(75) Inventor: Terry L. Gilton, Boise, ID (US)

(73) Assignee: Micron Technology, In., Boise, ID (US)

( * ) Notice: Subject to any disclaimer, the term of this patent is extended or adjusted under 35 U.S.C. 154(b) by 0 days.

(21) Appl. No.: 09/544,721

(22) Filed: Apr. 6, 2000

(51) Int. Cl.[7] ................................................ H01L 21/3063
(52) U.S. Cl. .................. 438/745; 438/749; 438/750; 438/751; 438/754
(58) Field of Search .................... 438/745, 750, 438/753, 754, 637, 638, 639; 134/1.1, 1.2, 1.3; 156/345

(56) References Cited

U.S. PATENT DOCUMENTS

| | | | |
|---|---|---|---|
| 5,476,816 | * 12/1995 | Mautz et al. | 438/622 |
| 5,630,904 | * 5/1997 | Aoyama et al. | 438/669 |
| 5,705,089 | * 1/1998 | Sugihara et al. | 252/79.1 |
| 5,946,589 | * 8/1999 | Ng et al. | 438/586 |
| 6,012,469 | * 1/2000 | Li et al. | 134/1.3 |

* cited by examiner

Primary Examiner—Benjamin L. Utech
Assistant Examiner—Lan Vinh
(74) Attorney, Agent, or Firm—Knobbe, Martens, Olson & Bear, LLP.

(57) ABSTRACT

A wafer cleaning process is disclosed for quenching etch reactions while rinsing etch reactants and etch products from the wafer. Holes are etched through an insulating layer by reactive ion etch, for example. The holes might comprise contact openings over a semiconductor substrate, or vias through insulating layers between metal lines. An organic or polymer residue left in the holes is cleaned by a wet process. The cleaning process continues to attack sidewalls of the holes, undesirably widening them. The wafer is therefore rinsed with a rinse agent below 0° C., thermally quenching further etching of the sidewalls and affording greater control over the hole dimensions. At the same time, the rinse agent allows relatively rapid diffusion of etchants and etch products from narrow and deep openings. An exemplary rinse agent for such low temperature rinsing is dilute ethylene glycol ($C_2H_6O_2$).

36 Claims, 5 Drawing Sheets

LOW TEMPERATURE RINSE OF ETCHING AGENTS

FIELD OF THE INVENTION

This invention is related to semiconductor device fabrication and processing, and more particularly, to rinsing semiconductor substrates following etch processes.

BACKGROUND OF THE INVENTION

There are numerous semiconductor process steps involved in the development of modern day integrated circuits (ICs). From the initial fabrication of silicon substrates to final packaging and testing, integrated circuit manufacturing involves many fabrication steps, including photolithography, doping, etching and thin film deposition. As a result of these processes, integrated circuits are formed of microscopic devices and wiring amid multiple layers.

In so-called "front end" processes, basic electronic devices, such as transistors and capacitors, are formed in and over a semiconductor substrate. "Back end" processes involve electrically connecting devices with contacts and wires integrally formed in the chip, in patterns dictated by circuit design. During the back end processes, conductive layers are separated from each other by insulating layers or interlevel dielectrics (ILDs). Contacts extend through ILDs to electrically connect overlying and underlying conductive layers. Typically, contact openings or vias are patterned and etched in the ILDs, such as by photolithographic and etch processes. Conductive material then fills the contact vias to complete the contact.

In conventional metallization, a layer of metal is deposited over an ILD with contacts already formed therethrough. A mask is then formed over the layer of metal, and parts of the metal are etched through the mask to leave metal lines in a desired pattern. Spaces between the metal lines are then filled with an insulator (e.g., a form of silicon oxide) and the insulator is polished or otherwise etched back to leave a planar surface. Damascene patterning conversely involves forming the insulator or ILD, etching a pattern of trenches into the ILD, where the trenches are shaped in a desired wiring path and depositing metal into the trenches. Excess metal overlying the ILD is then polished back to leave wires isolated within the trenches. Similarly, in dual damascene processes, contacts and wiring layers are simultaneously formed. In addition to forming the trenches of the above-described damascene process, contact vias or openings extend from the bottoms of those trenches prior to the deposition of metal. As metal fills the trenches and vias, contacts and wires are simultaneously formed.

Today's market demands more powerful and faster integrated circuits. In pursuit of such speed and lower power consumption, device packing densities are continually being increased by scaling down device dimensions with each progressive generation of integrated circuit design. To date, this scaling has reduced gate electrode widths to less than 0.25 $\mu$m. Currently, commercial products are available employing gate widths or critical dimensions of 0.18 $\mu$m or less.

As the spacing between devices on the substrate shrinks to obtain high density integration, lateral dimensions of metal wires or interconnect layers, as well as the contact holes and the via holes, are commensurately scaled down. However, due to reliability and parasitic capacitance concerns, there is a limit on shrinking the thickness of the interlevel dielectric (ILD) layers. The resultant vias exhibit increasingly high aspect ratios (the depth divided by width), introducing numerous problems for chip fabrication.

Dry etch processes, particularly reactive ion etch (RIE), advantageously result in vertical via walls, enabling high packing density. Energetic ions vertically impinge upon a masked substrate and etch holes or vias through openings in the mask. The resulting vias, however, are left with an organic residue, often referred to as a polymer, on the sidewalls of the holes. This polymer needs to be thoroughly cleaned to avoid contamination of the contact to be formed and to obtain good electrical interconnection between conductive layers.

Cleaning processes that effectively remove the polymer tend also to attack the materials surrounding the vias, such as the dielectric walls defining vias through ILD's. While a slight etch of the via walls advantageously undercuts the polymer and aids in its removal, overetching of the via walls can lead to short circuits and parasitic capacitance across closely spaced adjacent contacts. Such overetching can similarly produce a lack of precise control over feature dimensions during etching in a variety of different contexts in semiconductor fabrication.

Accordingly, a need exists for methods of strictly controlling etch processes, such as polymer cleaning from an opening after dry etch.

SUMMARY OF THE INVENTION

In satisfaction of this need, in accordance with one aspect of the invention, a process is described in the fabrication of an integrated circuit on a semiconductor substrate. The process includes etching openings in an insulating layer through a photoresist mask. Etching agents are then rinsed from the openings with a solvent at a temperature less than 0° C.

In the preferred embodiments, the openings are etched by a process including physical bombardment, leaving a polymer residue in the openings. The residue is then cleaned by a process that also attacks sidewalls of the openings. The etching agents are left in the openings by the cleaning process, which are then rinsed with a cold solvent. The preferred solvent comprises ethylene glycol, though other fluids with low freezing points will also be appropriate.

In accordance with another aspect of the invention, a method is provided for rinsing etchants and etch by-products from a semiconductor substrate assembly. The method includes exposing the semiconductor substrate assembly to ethylene glycol immediately after an etch step.

In accordance with another aspect of the invention, a process is provided for forming electrical contact through an insulating layer in an integrated circuit. The process includes forming and patterning a photoresist mask over the insulating layer. Holes are then etched into the insulating layer through the mask to expose a conductive element and leave an organic residue in the holes. This organic residue is then cleaned from the holes, followed by rinsing the holes with a fluid at a temperature less than 0° C.

BRIEF DESCRIPTION OF THE DRAWINGS

The foregoing aspects and others will be apparent to the skilled artisan from the following description with reference to the accompanying drawings, which are meant to illustrate and not to limit the invention, and in which.

DETAILED DESCRIPTION OF THE PREFERRED EMBODIMENT

While illustrated in the context of wet cleaning of polymers formed by etching contact openings and vias while processing an integrated circuit, the skilled artisan will readily find application for the principles disclosed herein in a number of contexts. The disclosed methods have particular utility for wet cleaning of polymers from high aspect ratio vias and other contact openings.

Figure 1:
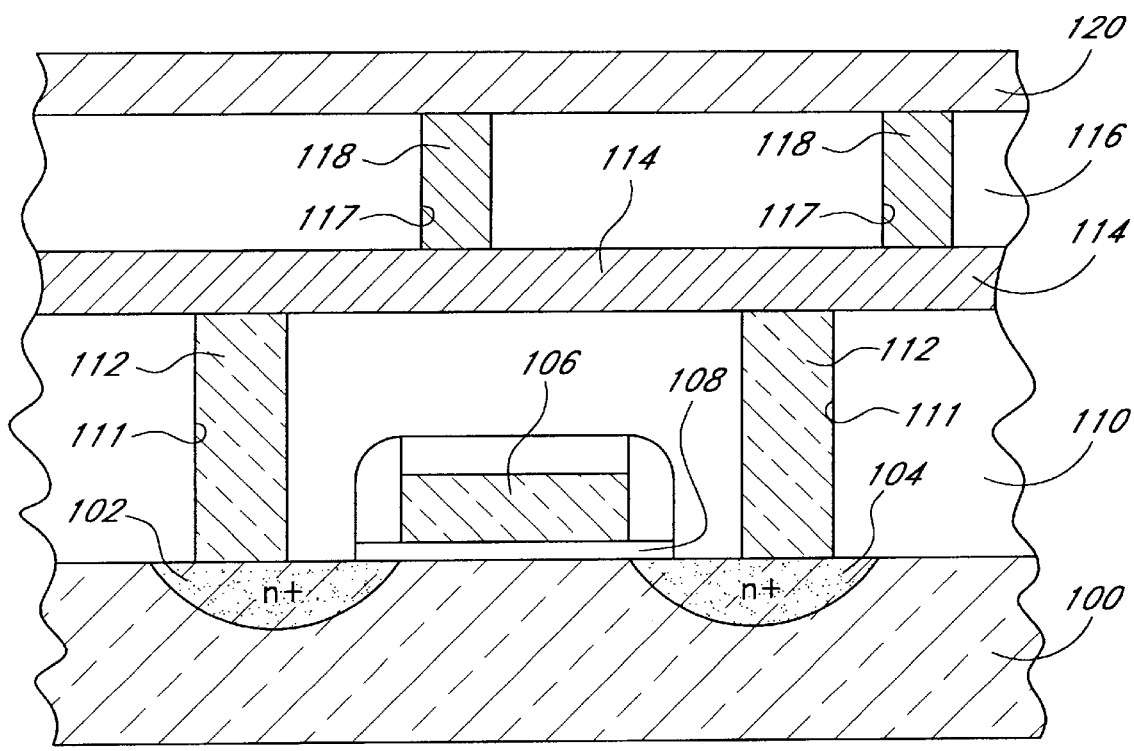
FIG. 1 is a schematic cross-section, illustrating a semiconductor substrate supporting a transistor and a stack of interconnected layers.

FIG. 1 schematically shows an exemplary portion of an integrated circuit, illustrating interconnections from transistors to upper metal layers. In today's integrated circuit manufacturing industry, several such wiring layers are typically employed for realizing rather complicated circuit functions. As shown in FIG. 1, a transistor is fabricated on a semiconductor substrate 100, where the transistor includes a gate electrode 106, a gate oxide 108 under the gate electrode 106, a source region 102 and a drain region 104. A layer of insulating or dielectric material 110 is formed over the substrate 100. The insulator 110 typically comprises a form of silicon oxide, particularly doped with impurities, such as borophosphosilicate glass (BPSG) or oxide deposited from tetraethylorthosilicate (TEOS).

Contact openings 111 are patterned by lithographic masks and etched. Conductive plugs or contacts 112 fill the contact openings 111, forming conducting paths from the source/drain regions 102 and 104 to the upper levels. Contacts to the substrate 100 typically comprise polysilicon or tungsten plugs. A first metal or otherwise conductive thin film 114 is formed in a wiring pattern over the contacts 112. Another dielectric layer 116, typically comprising TEOS or a low k dielectric, is deposited on the first conductive thin film 114. Another set of contact openings or vias 117 are patterned by photolithography and etched. A set of plugs 118 are formed in the vias 117 and a second metal layer 120 is formed in a second wiring pattern contacting the plugs 118. The plugs 118 and lines 120 can be formed simultaneously in dual damascene schemes.

Insulators between metallization layers are often referred to as interlevel dielectrics (ILDs). The process of alternating ILD layers and metal layers is repeated multiple times, using different mask patterns, to complete the connections called for by the circuit design. It will be understood that the metal layers 114, 120 can include alloys and multiple sub-layers, such as adhesion layers, barrier layers, anti-reflection layers, etc.

As noted in the "Background" section above, the trend in integrated circuit fabrication is to further miniaturize devices. With devices getting smaller, contacts and vias with deeper aspect ratios are increasingly being packed closer together. The close proximity of adjacent contacts, plugs and lines can lead to short circuits and parasitic capacitants. Uncontrolled etch processes in creating contact openings, trenches and vias can lead to overetching, widening these openings and thereby increasing the proximity of conductive fillers. Similarly, when etching metal lines or via openings onto metal landing pads, overetching metal can have an adverse effect upon conductivity of the wiring layers.

One example of such an uncontrolled etch process is the wet clean process performed to clean polymer residue left by photolithography and dry etch processes. Such wet clean processes can further etch the sidewalls of contact openings and/or exposed conductors. The thin film polymer in the openings is a residual by-product of dry etching, particularly by sputter and reactive ion etching (RIE), through photoresist masks, whether in creating contacts 112 to the substrate 100 or plugs 118 between wiring layers 114 and 120.

Figure 2A:
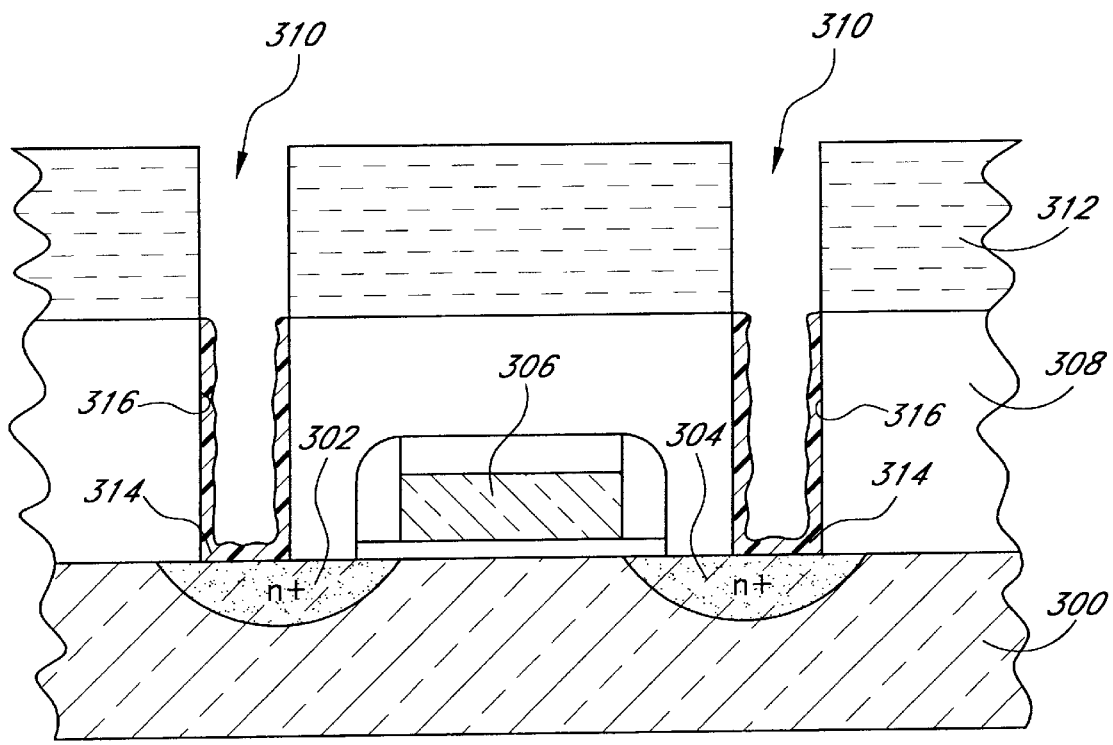
FIGS. 2A through 2D are schematic cross-sections, illustrating a rinse process following etching of contact openings to a semiconductor substrate, in accordance with a preferred embodiment of the present invention.

With reference now to FIG. 2A, a semiconductor substrate 300 is illustrated with a source region 302 and a drain region 304 formed therein. The transistor gate stack 306 is formed over the substrate 300 between the active areas 302, 304. An insulating layer 308 overlies the substrate 300, and contact openings 310 are formed within the insulating layer 308.

As shown, the contact openings 310 are etched through a photoresist mask 312, preferably by dry etching and more preferably by reactive ion etch (RIE). As a result of such dry etching, an organic film, commonly referred to as a polymer 314, lines sidewalls 316 of the contact openings 310. Because the polymer 314 would interfere with the conductivity of contacts to be formed within the openings 310, the polymer is desirably removed prior to further processing.

Conventionally, the polymer 314 is removed by wet or vapor etch processing. For example, dilute hydrofluoric acid (dilute HF) is often employed to remove the polymer 314. Hydrofluoric acid, however, also tends to attack oxides typically used for the insulating layer 308. While a slight undercut advantageously aids in removal of the polymer 314, etching of the sidewall 308 also tends to widen the contact openings 310 until all the etchants have been rinsed away. Similarly, polymer cleaning solutions comprising ammonium fluoride ($NH_4F$) and phosphoric acid ($H_3PO_4$) also attack the oxide sidewalls 311. The polymer cleaning process therefore undermines the control of critical dimensions afforded by RIE. Rather than remaining faithful to the patterns dictated by the photoresist mask 312, contact openings 310 continue to be widened by etching of the sidewalls 311 even after the polymer 314 has been removed, and even during the rinsing process.

Figure 2B:
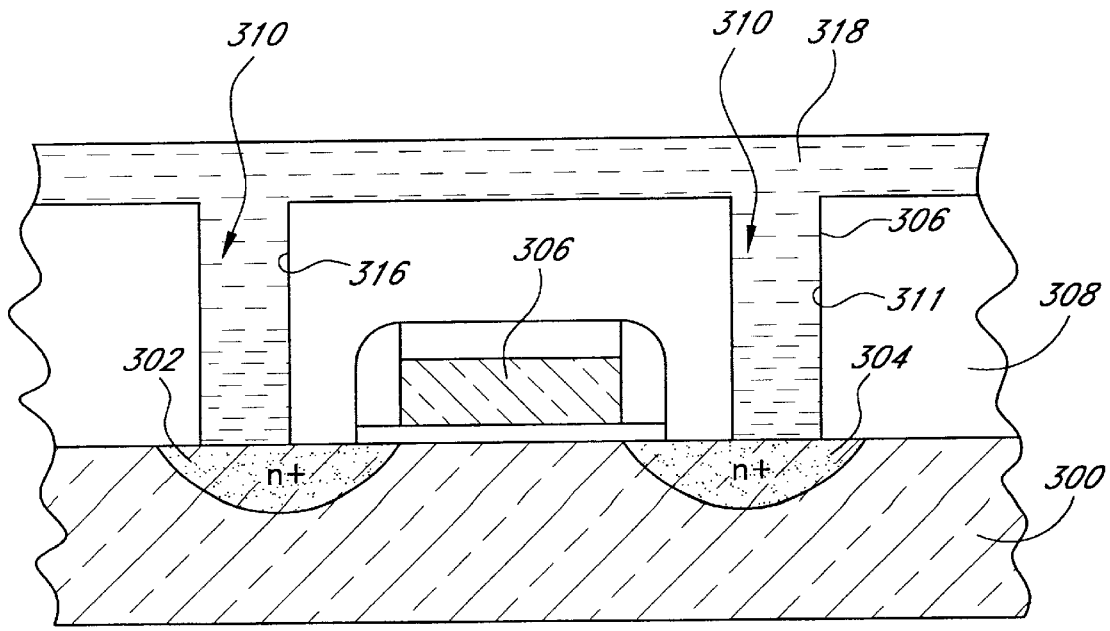

Referring now to FIG. 2B, the preferred embodiment therefore employs a low temperature rinse agent or solvent 318 to rinse etchants and etch by-products from the contact openings 310. In order to impede undesirable oxide etching from the polymer cleaning process, the rinsing agent 318 is maintained at a temperature less than 0° C., preferably less than about −5° C., and more preferably less than about −20° C. Desirably, the rinsing agent at these low temperatures quickly and effectively quenches the oxide etching reaction of the polymer cleaning solution.

The rinse agent or solvent 318 is delivered at a temperature greater than the freezing point of the etchants. Desirably, even at sub-zero (Celsius) temperatures, if the rinse agent 318 is kept in fluid form, etchants and etch products can diffuse out of the deep contact holes 310 quickly enough for commercial requirements. Thus, a balance can be achieved for current and future circuit designs between etch quenching and rinsing out or out-diffusion of reactants.

The rinsing agent 318 of the illustrated embodiment includes ethylene glycol ($C_2H_6O_2$) due to its desirable characteristics within the preferred operating temperature ranges. Ethylene glycol is commonly employed as an antifreeze, having a freezing point at about −13° C. under atmospheric conditions, and remaining liquid well above room temperature (pure ethylene glycol has a boiling point of about 197° C.). Furthermore, ethylene glycol is completely miscible with water and many organic liquids, serves as an effective solvent for dissolving and out-diffusing etchants from deep openings and vias, does not easily vaporize and can be easily rinsed by subsequent deionized (DI) water. Advantageously, the rinse agent 318 preferably also includes water, further depressing the freezing temperature of the solvent. Dilute ethylene glycol, e.g., 50% ethylene glycol in distilled water, has a freezing point of about −37° C. The illustrated rinse agent 318 preferably comprises between about 50% and 100% ethylene glycol, such that the freezing temperature is preferably between about −13° C. and −37° C.

In other arrangements, suitable low temperature solvents include; liquid ammonia ($NH_3$), which remains liquid between about −77.7° C. and −33.4° C. under atmospheric conditions; liquid carbon dioxide ($CO_2$), which remains liquid under pressure (e.g., 5–30 atm) at low temperatures (e.g., freezing point of about −56.6° C. at 5 atm); and propylene glycol ($C_3H_8O_2$), another common antifreeze fluid useful between about −60° C. and 188° C. As with ethylene glycol, these solvents can also be mixed with other fluids to form the desired low temperature rinse agent.

The chilled rinse 318 can be conducted in a stagnant dip, but is preferably a cascade or overflow rinse. Desirably, the chilled rinse is conducted for sufficient time to diffuse etchants and etch by-products from the contact openings 310. Preferably, the chilled rinse is conducted for between about 0.5 minutes and 30 minutes, and more preferably between about 5 minutes and 10 minutes.

Figure 2C:
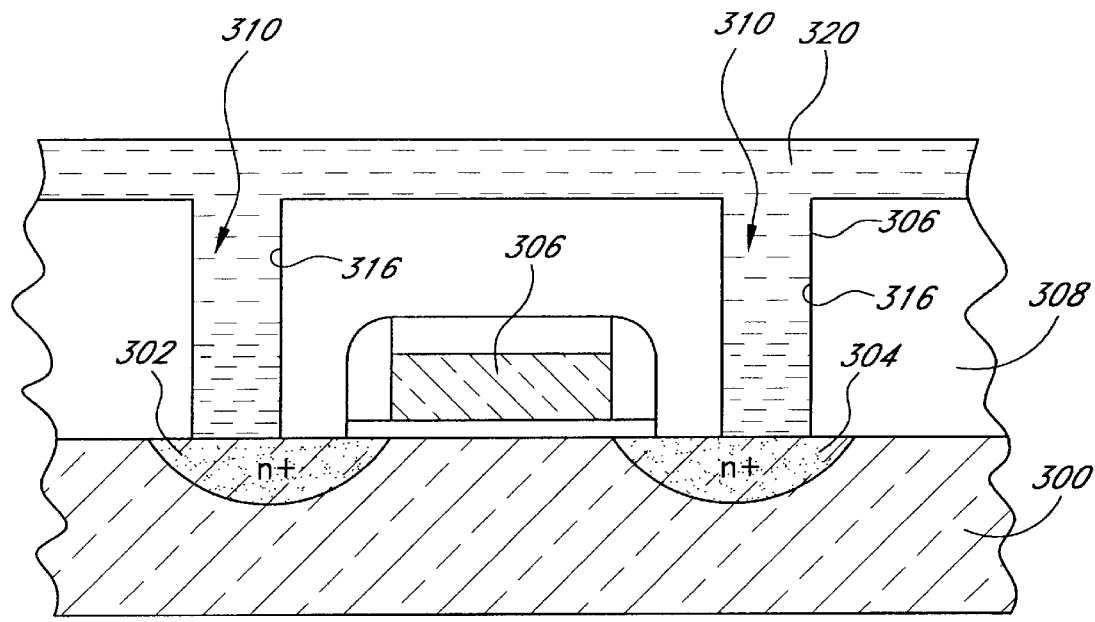
Figure 2D:
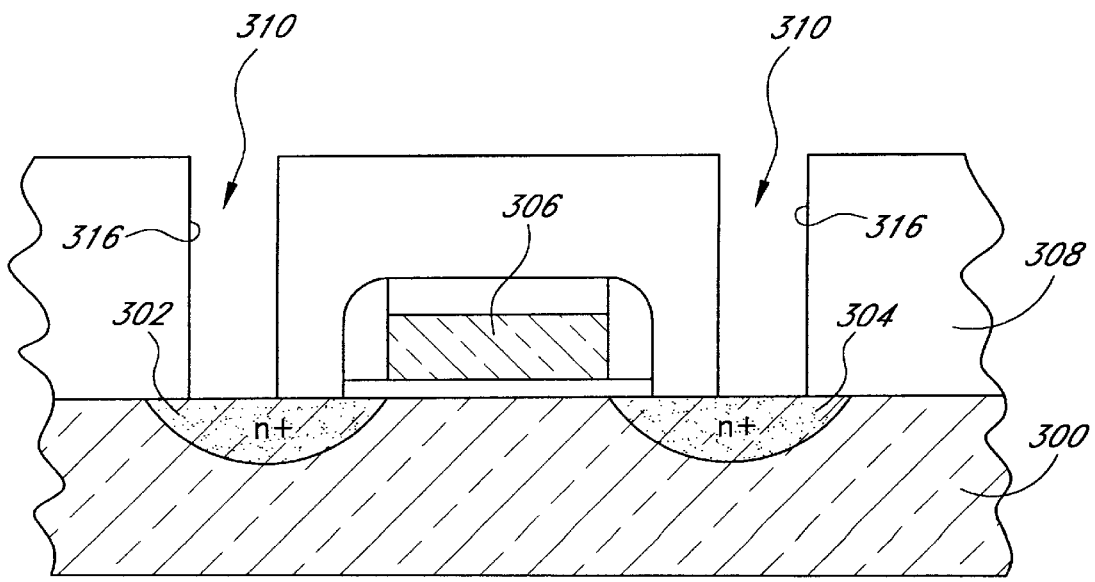

FIG. 2C illustrates the contact openings 310 filled with deionized (DI) water 320 at room temperature in a preferred second stage rinse. Once the previous etching of the sidewalls 316 is halted and the etchants and etch products are completely diffused out of the contact openings 310, the chilled rinse agent 318 is preferably rinsed from the workpiece. A standard deionized (DI) water rinse can be employed for this optional second rinse. Preferably, the rinse comprises a DI water overflow at room temperature for between about 0.5 minutes and 30 minutes, more preferably between about 5 minutes and 10 minutes.

With or without the optional second stage rinse, the workpiece is preferably dried of rinse agents after the rinse. Most preferably, the workpiece is dried by exposure to a vapor dry process by exposure to a vapor degreaser, such as isopropyl alcohol (IPA). Alternatively, the workpiece can be spin-dried or dried by any other suitable process, as will be appreciated by the skilled artisan.

With reference now to FIGS. 3A to 3D, a cleaning process is exemplified for vias formed in interlevel dielectric (ILD) layers during back end or metallization processing, in accordance with a second embodiment of the invention.

Figure 3A:
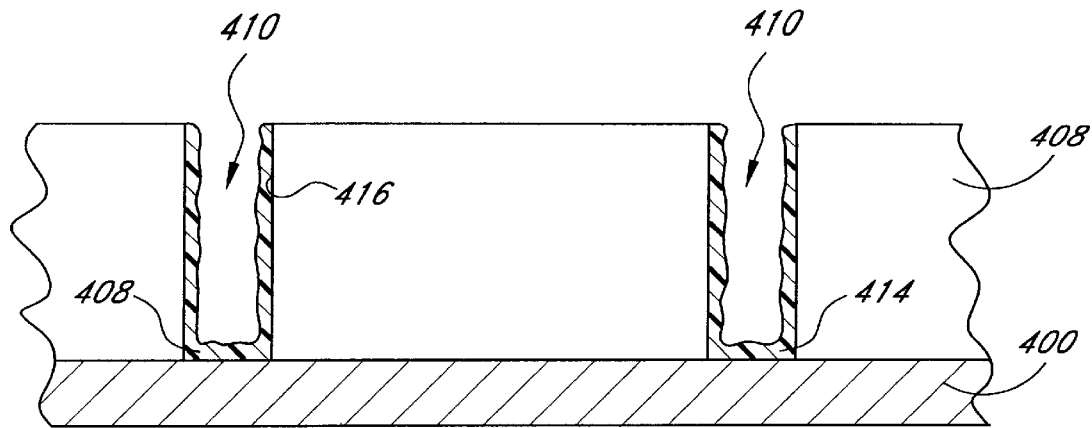
FIGS. 3A through 3D are schematic cross-sections, illustrating a rinse process following etching to open contact vias between metallization levels, in accordance with another preferred embodiment of the present invention.

FIG. 3A is a schematic cross-section, which illustrates an ILD 408 with contact openings or vias 410 on the surface of a metal layer 400. As a result of etching through an organic (photoresist) mask (not shown), a polymer layer 414 remains on the sidewalls 416 of the vias 410. As with the polymer formed over the substrate, this polymer should be cleaned to avoid interference with conductivity of plugs to be formed in the vias 410.

Additionally, the polymer composition is treated with polymer etchants, preferably comprising an amine-based solution, to aid in removing the polymer layer 408. Exemplary solutions for wet cleaning of metal-impregnated polymer residue are available from EKC Technology, Inc. of Hayward, Calif., and under the trade ACT™ from Ashland Chemical Co. of Columbus, Ohio. Like HF and ammonium fluoride/phosphoric acid, the polymer cleaning solution also tends to continue etching at the sidewalls 416 of the vias 410 until rinsed away.

Figure 3B:
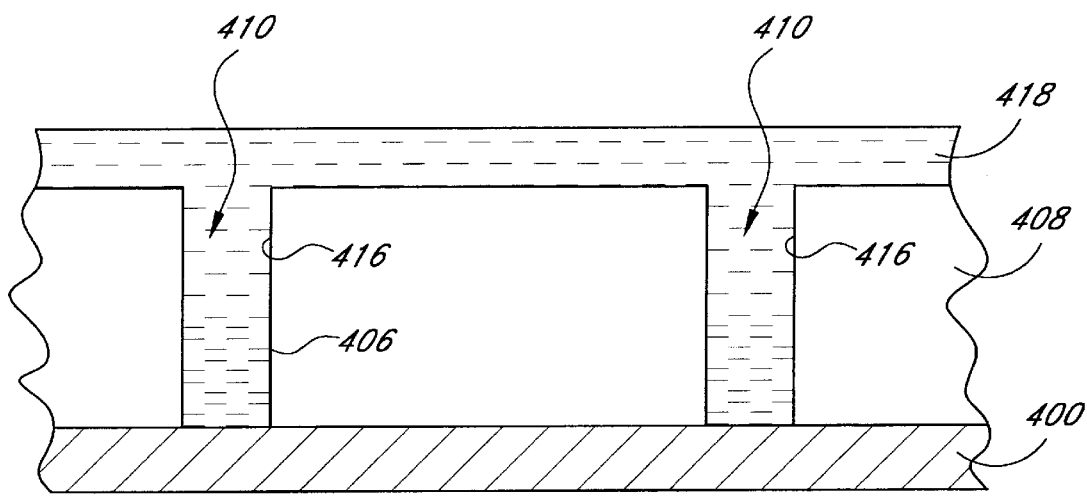

Accordingly, with reference now to FIG. 3B, a subsequent rinsing process employs a chilled rinse agent 418 to quench the polymer clean solution, thereby impeding further etching of the sidewalls 416. Desirably, the low temperature rinse continues to permit out-diffusion of the etch reactants and etch products from the vias 410. As described above, the rinsing agent preferably comprises ethylene glycol and more preferably comprises 50%–100% dilute ethylene glycol, delivered at a temperature between below 0° C. and preferably below about −13° C. (e.g., between about −13° C. and −37° C.). In other arrangements, other low temperature fluids, such as liquid ammonia, liquid $CO_2$ and propylene glycol can be employed at the preferred temperatures.

Figure 3C:
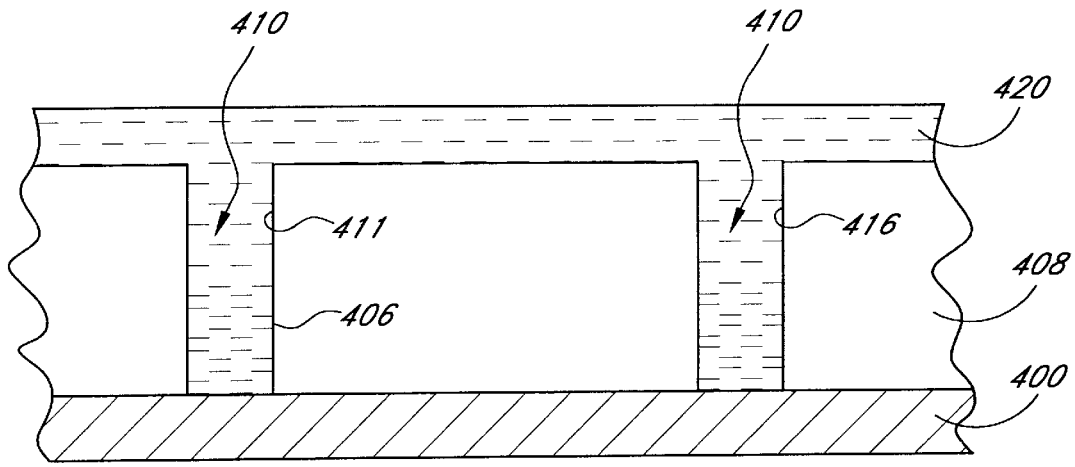

FIG. 3C illustrates the contact vias 410 filled with deionized (DI) water 420 at room temperature. After oxide etching is quenched and etchants and etch products are diffused out of the contact vias 410, the chilled rinse agent 418 is preferably also rinsed out of the contact vias 410. As with the previous embodiment, this second rinse preferably employs a simple DI water 420, such as a room temperature cascade for about 5 minutes to 10 minutes. The wafer is then preferably vapor dried prior to further processing.

Figure 3D:
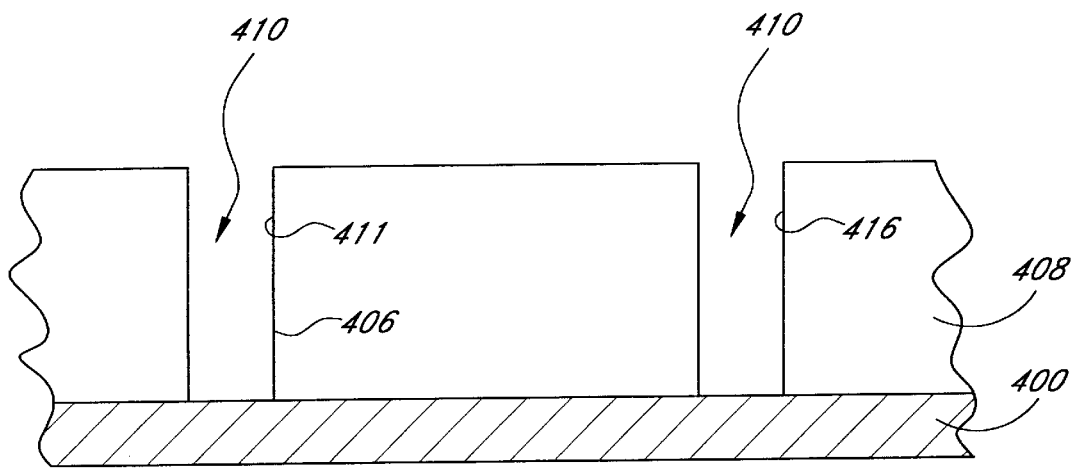

FIG. 3D illustrates contact vias 410 that are ready to be filled with conductive metal plugs or dual damascene contacts and runners. Advantageously, the dimensions of the cleaned vias 410 remain faithful to the mask defining them, rather than being widened beyond uncontrollably by the polymer cleaning step. The preferred embodiments thus entail more precise control over feature dimensions in integrated circuit fabrication, an advantage ever more vital as circuitry continues to be scaled.

It will be apparent to those skilled in the art that various modifications and variations can be made to the disclosed process without departing from the spirit of the invention. For example, while the preferred embodiments describe low temperature rinsing after polymer clean steps, the skilled artisan will appreciate that various other reactions can be better controlled by implementation of a quenching rinse at a desired end point of the process, particularly following etch steps, and more particularly following wet etch. In view of the foregoing, it is intended that the present invention cover modifications and variations of this invention provided they fall within the scope of the following claims and their equivalents.

I claim:

1. A process during fabrication of an integrated circuit on a semiconductor substrate, comprising:
   etching openings in an insulating layer through a photoresist mask; and
   rinsing etching agents from the openings with a chilled rinse agent at a temperature less than 0° C.

2. The process of claim 1, wherein etching the openings comprises a physical etch component.

3. The process of claim 1, wherein the chilled rinse agent is at a temperature less than about −5° C.

4. The process of claim 1, further comprising rinsing the chilled rinse agent from the openings with deionized water.

5. The process of claim 1, wherein the chilled rinse agent comprises an alcohol.

6. The process of claim 3, wherein the chilled rinse agent is at a temperature less than about −20° C.

7. The process of claim 2, wherein the etching the openings comprises a reactive ion etch.

8. The process of claim 7, wherein the etching the openings leaves a polymer residue within the openings.

9. The process of claim 8, further comprising cleaning the polymer residue with the etching agents prior to rinsing the etching agents.

10. The process of claim 5, wherein the chilled rinse agent comprises a glycol.

11. The process of claim 5, wherein the chilled rinse agent further comprises water.

12. The process of claim 10, wherein the chilled rinse agent comprises ethylene glycol.

13. The process of claim 9, wherein the etching agents comprise an amine-based solution.

14. The process of claim 9, wherein the openings expose a semiconductor substrate.

15. The process of claim 9, wherein the openings expose a metal element above a substrate.

16. The process of claim 13, wherein the deionized water is at room temperature.

17. The process of claim 9, wherein the etching agents etch the insulating layer in which the openings are etched.

18. The process of claim 17, wherein the etching agents comprise aqueous hydrofluoric acid.

19. The process of claim 18, wherein the etching agents further comprise phosphoric acid.

20. The process of claim 19, wherein the deionized water is at a temperature above 0° C.

21. A method of rinsing etchants and etch by-products from a semiconductor substrate assembly, the method comprising exposing the semiconductor substrate assembly to ethylene glycol immediately after an etch step wherein the ethylene glycol is at a temperature below about 0° C. while exposing.

22. The method of claim 21, wherein the ethylene glycol is diluted in water and kept at a temperature below about −13° C. while exposing.

23. The method of claim 21, wherein exposing comprises flowing the ethylene glycol over the substrate assembly.

24. The method of claim 21, wherein the substrate assembly comprises openings through an insulating layer exposing a semiconductor substrate, the openings including the etchants and etch by-products.

25. The method of claim 21, wherein the substrate assembly comprises vias through an insulating layer exposing a metal element, the vias including the etchants and etch by-products.

26. The method of claim 21, further comprising removing the ethylene glycol from the substrate assembly with deionized water.

27. The method of claim 26, wherein removing comprises flowing the deionized water over the substrate assembly.

28. A process for forming electrical contact through an insulating layer in an integrated circuit, comprising:

forming and patterning a photoresist mask over the insulating layer;

etching holes into the insulating layer through the mask to expose a conductive element and leave an organic residue in the holes;

cleaning the organic residue from the holes;

rinsing the holes with a rinse agent at a temperature less than about −5° C. after cleaning the organic residue from the holes;

spin drying said wafer until said deionized water is dry from said dielectric thin film surfaces and from inside of said via openings.

29. The process of claim 28, wherein the rinse agent comprises ethylene glycol.

30. The process of claim 28, wherein the rinse agent comprises liquid ammonia.

31. The process of claim 28, wherein the rinse agent comprises propylene glycol.

32. The process of claim 28, wherein the rinse agent comprises an aqueous alcohol mixture.

33. The process of claim 28, wherein rinsing the holes comprises maintaining the rinse agent at a temperature between about −13° C. and −37° C.

34. The process of claim 28, further comprising rinsing the holes with deionized water.

35. The process of claim 34, further comprising vapor drying the deionized water from the holes.

36. The process of claim 35, wherein vapor drying comprises exposing the holes to isopropyl alcohol.

\* \* \* \* \*